(12) United States Patent
Niwa

(10) Patent No.: US 10,491,225 B2
(45) Date of Patent: Nov. 26, 2019

(54) CLOCK GENERATING DEVICE, ELECTRONIC CIRCUIT, INTEGRATED CIRCUIT AND ELECTRICAL MACHINERY

(71) Applicant: Rohm Co., Ltd., Kyoto (JP)

(72) Inventor: Isao Niwa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/488,676

(22) Filed: Apr. 17, 2017

(65) Prior Publication Data
US 2017/0302285 A1    Oct. 19, 2017

(30) Foreign Application Priority Data

Apr. 19, 2016   (JP) ................. 2016-083753

(51) Int. Cl.
| | | |
|---|---|---|
| H03L 1/04 | (2006.01) | |
| H03B 5/36 | (2006.01) | |
| H03B 5/30 | (2006.01) | |
| H03L 1/02 | (2006.01) | |
| G11C 7/10 | (2006.01) | |
| G06F 1/08 | (2006.01) | |
| G05D 11/13 | (2006.01) | |
| H03L 7/099 | (2006.01) | |
| G11C 17/08 | (2006.01) | |
| H03B 5/32 | (2006.01) | |
| H03L 7/181 | (2006.01) | |

(52) U.S. Cl.
CPC .............. *H03L 7/099* (2013.01); *G11C 17/08* (2013.01); *H03B 5/32* (2013.01); *H03L 7/181* (2013.01)

(58) Field of Classification Search
CPC ............ H03L 7/099; H03L 7/181; H03B 5/32
USPC .............. 327/2–12, 105–123, 141, 144–163; 331/1 A, 15–17; 375/373–376
See application file for complete search history.

(56) References Cited

U.S. PATENT DOCUMENTS

| | | | | |
|---|---|---|---|---|
| 5,471,176 A * | 11/1995 | Henson | ................. | G06F 1/08 331/1 A |
| 6,209,071 B1 * | 3/2001 | Barth | ................. | G06F 13/16 711/167 |
| 2003/0098749 A1 * | 5/2003 | Terasawa | ............ | H03K 3/0307 331/74 |
| 2005/0057295 A1 * | 3/2005 | Tsai | ................. | G06F 13/4278 327/291 |

(Continued)

FOREIGN PATENT DOCUMENTS

| | | |
|---|---|---|
| CN | 1584774 A | 2/2005 |
| CN | 101026377 A | 8/2007 |

(Continued)

*Primary Examiner* — Brandon S Cole
(74) *Attorney, Agent, or Firm* — Fish & Richardson P.C.

(57) ABSTRACT

The present invention is related to a clock generating device for generating an internal clock signal having a frequency correlated with a clock frequency of an external oscillator when the clock frequency of the external oscillator is not specified in advance. A clock generating device 105 comprises a memory 134 and a PLL circuit 120. The memory 134 is configured to store information about a frequency of an external clock signal generated by an external oscillator 200 at a predetermined timing. The PLL circuit 120 generates a second clock signal correlated with a first clock signal based on the information stored in the memory 134.

20 Claims, 6 Drawing Sheets

(56) References Cited

U.S. PATENT DOCUMENTS

| | | | |
|---|---|---|---|
| 2011/0205380 A1* | 8/2011 | Shirakawa | H04N 5/232 348/211.9 |
| 2013/0313332 A1* | 11/2013 | Isohata | H03L 1/02 236/1 F |
| 2015/0116048 A1* | 4/2015 | Yamamoto | H03B 5/362 331/116 FE |
| 2016/0285461 A1* | 9/2016 | Okubo | H03L 1/028 |
| 2018/0041217 A1* | 2/2018 | Murakami | G01C 19/5614 |

FOREIGN PATENT DOCUMENTS

| | | |
|---|---|---|
| CN | 101490960 A | 7/2009 |
| CN | 101645718 A | 2/2010 |
| CN | 101911496 A | 12/2010 |
| CN | 102291122 A | 12/2011 |
| CN | 104079755 A | 10/2014 |
| JP | 2008-154199 | 7/2008 |
| JP | 2010-003199 | 1/2010 |
| JP | 2015-103853 | 6/2015 |

\* cited by examiner

CLOCK GENERATING DEVICE, ELECTRONIC CIRCUIT, INTEGRATED CIRCUIT AND ELECTRICAL MACHINERY

BACKGROUND

The present invention relates to a clock generating device, and further relates to an electronic circuit, an integrated circuit and electrical machinery that incorporate the clock generating device. In particular, the present invention relates to a clock generating device for performing processing in synchronization with a clock signal generated by an oscillator provided externally, and an electronic circuit, an integrated circuit, and electrical machinery that incorporate the clock generating device.

An electronic circuit that performs processing in synchronization with a system clock signal generated by an externally provided oscillator (hereinafter also referred to as "external oscillator") is known. Since external oscillators are constructed using, for example, a crystal vibrator, frequency accuracy is high, but the external oscillators are not protected by a package, so there is a possibility of failure due to dust or the like. If the external oscillator fails, the electronic circuit cannot operate and cannot notify an external microcomputer of the error, for example.

As an example, Patent Literature 1 discloses a semiconductor integrated circuit that performs processing in synchronization with a system clock signal generated by an external oscillator. The semiconductor integrated circuit further includes an oscillator (hereinafter referred to as "internal oscillator") provided therein. With the semiconductor integrated circuit, when an abnormality of the external oscillator is detected, a system clock signal is generated by the internal oscillator.

As a result, the semiconductor integrated circuit can operate continuously using the system clock signal generated by the internal oscillator even if an abnormality occurs in the external oscillator.

PRIOR TECHNICAL LITERATURE

[Patent Literature 1] JP20103199A

BRIEF SUMMARY OF THE INVENTION

Problems to be Solved in the Present Invention

As with the semiconductor integrated circuit disclosed in the above Patent Literature 1, in order to operate an electronic circuit using an internal oscillator when an external oscillator functions abnormally, it is necessary that the clock frequency of the internal oscillator is correlated with the clock frequency of the external oscillator. When such an electronic circuit, which incorporates the semiconductor integrated circuit, is a dedicated product used for a specific system, the clock frequency used for the operation of the electronic circuit can be specified in advance. Therefore, the clock frequency of the internal oscillator and the clock frequency of the external oscillator can be correlated.

However, when the electronic circuit is a general-purpose product for use in multiple systems, the clock frequency necessary for the operation of the electronic circuit may vary depending on the specifications of the system to which the electronic circuit is applied. Therefore, when the electronic circuit is shipped, the clock frequency to be used cannot be specified in advance, and there may be a case in which it is impossible to correlate the clock frequency of the internal oscillator and the clock frequency of the external oscillator. In such case, when an abnormality occurs in the external oscillator, continuous operation of the electronic circuit cannot be guaranteed.

The present invention has been created in order to solve such problem. An objective of the present invention is to provide a clock generating device capable of generating an internal clock signal having a frequency correlated with a clock frequency of an external oscillator when a clock frequency of the external oscillator is not predetermined.

Technical Means for Solving Problems

A clock generating device according to an aspect of the present invention uses a first clock signal generated in accordance with oscillation of an externally provided first oscillator. The clock generating device comprises a memory and a second oscillator. The memory is configured to store information on the frequency of the first clock signal at a predetermined timing. The second oscillator generates a second clock signal correlated with the first clock signal based on the information stored in the memory.

An electronic circuit according to another aspect of the present invention includes the clock generating device, a logic circuit, an analog circuit, and an I/O circuit. The logic circuit performs processing in synchronization with the first clock signal or the second clock signal output from the clock generating device. The analog circuit and the I/O circuit are connected to the logic circuit.

An integrated circuit according to another aspect of the present invention is an integrated circuit in which the clock generating device is integrated.

An electrical machine according to another aspect of the present invention is an electrical machine equipped with the clock generating device.

With the clock generating device, and with the electronic circuit, integrated circuit and electrical machine (the latter three hereinafter referred to as "clock generating devices") that incorporate the clock generating device, information on the frequency of the first clock signal (external clock signal) is stored in the memory at a predetermined timing. A second clock signal (internal clock signal) correlated with the first clock signal is generated by a second oscillator (internal oscillator) based on the information stored in the memory. Compared to the external oscillator, the internal oscillator is less likely to fail due to dust or the like. That is, with the clock generating devices, a clock signal correlated with the clock frequency of the external oscillator can be more stably generated.

Preferably, the predetermined timing is the time of stable oscillation of the first oscillator. With the clock generating device, it is possible to more stably generate a clock signal correlated with the clock frequency at the time of stable oscillation of the external oscillator.

More preferably, the predetermined timing is a timing at which an instruction is received from a microcomputer external to the clock generating device.

With the clock generating device, for example, when communication between the external microcomputer and the clock generating device is started normally, it is possible to more stably generate a clock signal correlated with the clock frequency of an external oscillator while oscillating stably by receiving an instruction from the external microcomputer.

Still more preferably, the clock generating device further comprises a timer. The predetermined timing is the timing when the timer measures a predetermined length of time.

With the clock generating device, for example, if the length of time during which the first oscillator will shift to a stable oscillation state after the first oscillator begins oscillating is predetermined, it is possible to more stably generate a clock signal correlated with the clock frequency of the external oscillator while oscillating stably.

Preferably, the clock generating device outputs one of the first clock signal and the second clock signal.

With the clock generating device, for example, if an abnormality occurs in the first oscillator, an electronic circuit or similar device, which includes the clock generating device, can be operated using the second oscillator.

Preferably, in the clock generating device, the second oscillator is a PLL (Phase Locked Loop) circuit including a voltage-controlled oscillator whose oscillation frequency is set by an applied voltage. The information on the frequency of the first clock signal indicates the voltage applied to the voltage-controlled oscillator in order to generate a signal having a frequency corresponding to the frequency of the first clock signal.

With the clock generating device, by applying the voltage indicated by the information stored in the memory to the voltage-controlled oscillator, a second clock signal correlated with the frequency of the first clock signal can be generated by the PLL circuit.

More preferably, in the clock generating device, the voltage-controlled oscillator generates a third clock signal based on a real-time signal generated in real time by the first clock signal before the information is stored in the memory. After the information is stored in the memory, the voltage-controlled oscillator generates the second clock signal based on the information.

Still more preferably, in the clock generating device, the real-time signal is a voltage signal generated in real time by the first clock signal.

Also, preferably, the clock generating device further comprises a detection circuit for detecting an abnormality of the first oscillator by comparing the first clock signal and the second clock signal.

With the clock generating device, an abnormality of the first oscillator is detected by comparing the first clock signal and the second clock signal. According to the clock generating device, an internal clock signal correlated with the clock frequency of the external oscillator while the external oscillator is oscillating stably, is generated. Therefore, even if the clock frequency to be used is not predetermined, it is possible to detect an abnormality of the first oscillator (the external oscillator) by comparing the first clock signal and the second clock signal.

More preferably, in the clock generating device, the detection circuit detects an abnormality of the first oscillator when the difference between the number of rising edges of the first clock signal and the number of rising edges of the second clock signal within a predetermined period is two or more.

If the first oscillator is used for a significant length of time, even under normal operation, the phase difference between the first clock signal and the second clock signal may gradually increase. As the phase difference between the first clock signal and the second clock signal increases, even under normal operation of the first oscillator, there is a possibility that the maximum difference between the number of rising edges within a given period is one. With the clock generating device, when the difference between the number of rising edges becomes two or more, an abnormality of the first oscillator is detected. Therefore, even if the phase difference between the first clock signal and the second clock signal is increased, the possibility of false detection of an abnormality of the first oscillator can be reduced.

Still more preferably, the clock generating device further includes a detection circuit for detecting an abnormality of the first oscillator by comparing a real-time signal and a signal based on the information stored in the memory.

With the clock generating device, an abnormality of the first oscillator is detected by comparing the real-time signal and the signal based on the information stored in the memory. With the clock generating device, information for generating an internal clock signal, which is correlated with the clock frequency of the external oscillator while the external oscillator is oscillating stably, is stored in the memory. When the difference between the real-time signal and the signal based on the information stored in the memory is greater than expected, there is a high probability that an abnormality has occurred in the first oscillator. Therefore, with the clock generating device, it is possible to detect an abnormality of the first oscillator by comparing the real-time signal and the signal based on the information stored in the memory.

Still more preferably, the clock generating device outputs the second clock signal instead of the first clock signal when an abnormality of the first oscillator is detected by the detection circuit.

Therefore, with the clock generating device, even if an abnormality of the first oscillator is detected, by using the second clock signal generated by the second oscillator, it is possible to operate an electronic circuit or the like which incorporates the clock generating device.

Preferably, with the clock generating device, the information is fixed once it is stored in the memory.

Preferably, with the clock generating device, the memory is an OTPROM (One Time Programmable Read Only Memory).

Preferably, the frequencies of the first clock signal and the second clock signal are the same.

Effects of the Present Invention

The present invention provides a clock generating device capable of generating an internal clock signal having a frequency correlated with the clock frequency of an external oscillator when the clock frequency of the external oscillator is not predetermined.

DETAILED DESCRIPTION

Figure 1:
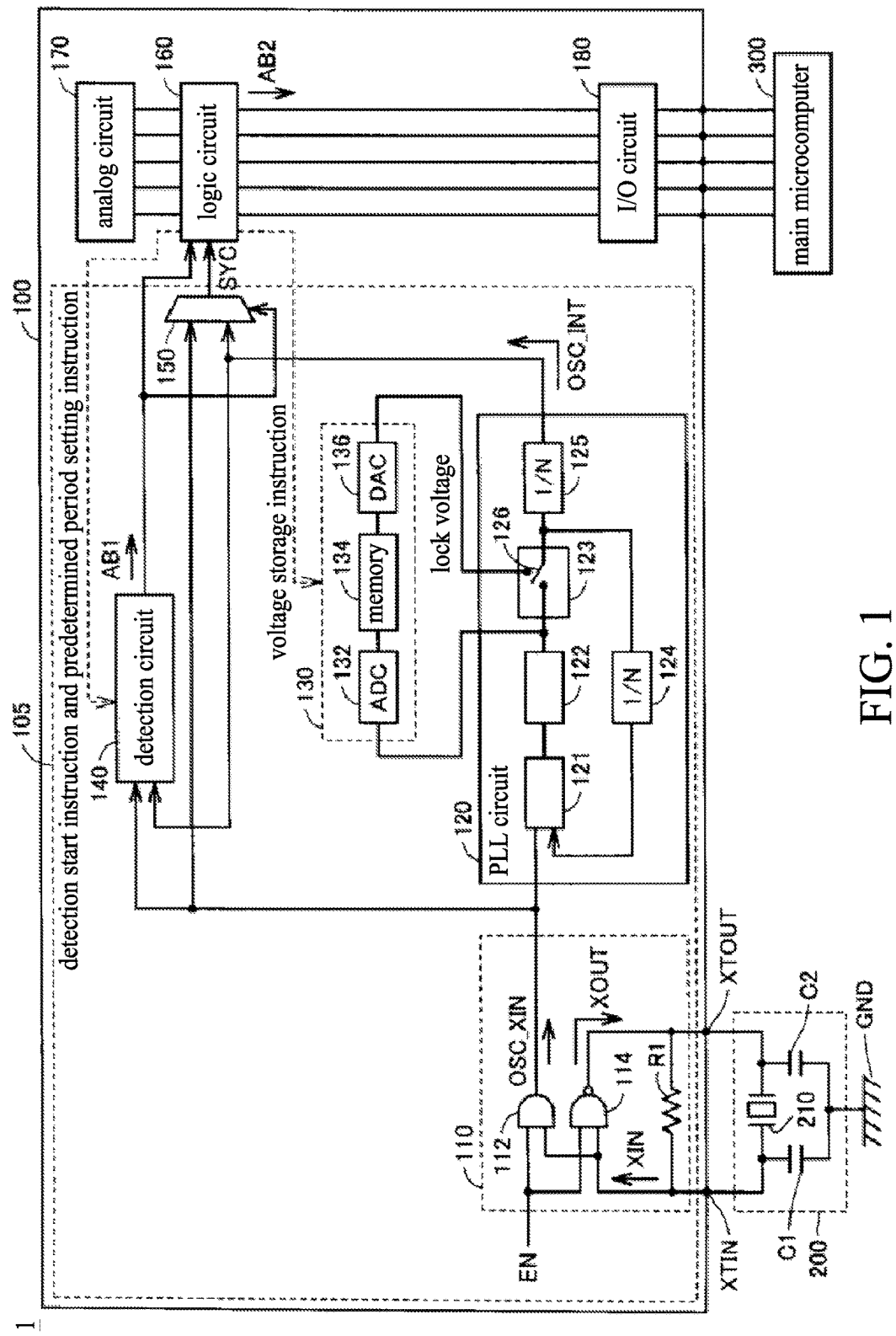
FIG. 1 is a configuration diagram of a system to which an electronic circuit according to a first embodiment is applied.

Hereinafter, embodiments of the present invention will be described in detail with reference to the drawings. In the drawings, the same or corresponding parts are denoted by the same reference numerals, and the description will not be repeated.

First Embodiment

[System Configuration]

FIG. 1 is a schematic diagram of a system 1 (for example, an electrical machine) to which an electronic circuit 100 according to a first embodiment is applied. Referring to FIG. 1, the system 1 comprises an electronic circuit 100, an external oscillator 200, and a microcomputer 300. During normal operation of the external oscillator 200, the electronic circuit 100 performs processing in synchronization with a clock signal (hereinafter also referred to as "external clock signal") generated by the external oscillator 200 and communicates with the microcomputer 300 as necessary.

The microcomputer 300 comprises, for example, a CPU (Central Processing Unit) (not shown) and an internal memory. The microcomputer 300 realizes the main functions of the system 1 by performing processing in accordance with a program stored in the internal memory (not shown). The microcomputer 300 is connected to the electronic circuit 100 and communicates with the electronic circuit 100 as necessary.

The external oscillator 200 includes a piezoelectric vibrator 210 and capacitors C1 and C2. One end of the piezoelectric vibrator 210 is connected to a terminal XTIN. The capacitor C1 is connected between one end of the piezoelectric vibrator 210 and a ground GND. The other end of the piezoelectric vibrator 210 is connected to a terminal XTOUT. The capacitor C2 is connected between the other end of the piezoelectric vibrator 210 and the ground GND. The external oscillator 200 generates a clock signal (external clock signal XIN) having a frequency corresponding to the characteristics of the piezoelectric vibrator 210 during stable vibration of the piezoelectric vibrator 210. The oscillation frequency of the external oscillator 200 is appropriately selected according to the specification of the system in which the electronic circuit 100 is used. The piezoelectric vibrator 210 uses, for example, a crystal vibrator or a ceramic vibrator. Therefore, the frequency accuracy of the external oscillator 200 is relatively high, for example 30 ppm or better.

The electronic circuit 100 is a semiconductor integrated circuit. The electronic circuit 100 includes a clock generating device 105, a logic circuit 160, an analog circuit 170, and an I/O (input/output) circuit 180. The clock generating device 105 includes an oscillation circuit 110, a PLL circuit 120, a memory unit 130, a detection circuit 140, and a multiplexer 150.

The oscillation circuit 110 includes an AND circuit 112, a NAND circuit 114, and a resistor R1. The AND circuit 112 has two input terminals, wherein one input terminal is connected to one end of the piezoelectric vibrator 210 through the terminal XTIN. An enable signal EN is input to the other input terminal of the AND circuit 112. An output terminal of the AND circuit 112 is connected to the PLL circuit 120, the detection circuit 140, and the multiplexer 150.

The NAND circuit 114 has two input terminals, one of which is connected to one end of the piezoelectric vibrator 210 through the terminal XTIN. An enable signal EN is input to the other input terminal of the NAND circuit 114. An output terminal of the NAND circuit 114 is connected to the other end of the piezoelectric vibrator 210 through the terminal XTOUT. The resistor R1 is connected between terminals XTIN and XTOUT.

When the enable signal EN is in an OFF state after a power supply (not shown) starts supplying power to the external oscillator 200, the AND circuit 112 outputs an OSC_XIN signal in an OFF state ("low signal") irrespective of the state of the other input terminal. In such case, the NAND circuit 114 outputs an XOUT signal in an ON state (a "high signal").

When the enable signal EN is turned on, the AND circuit 112 outputs the external clock signal OSC_XIN, which is the same as the external clock signal XIN, to the PLL circuit 120, the detection circuit 140, and the multiplexer 150. In such case, the NAND circuit 114 feeds back the clock signal XOUT, obtained by inverting the external clock signal XIN, to the piezoelectric vibrator 210 through the terminal XTOUT. Note that the configuration of the oscillation circuit 110 is not limited to the configuration described herein. For example, the oscillation circuit 110 may be realized by an inverter or the like. The oscillation circuit 110 may have any configuration as long as it can generate a clock signal.

The PLL circuit 120 includes a phase comparator 121, a low-pass filter 122, a voltage-controlled oscillator (VCO) 123, and frequency dividers 124 and 125. The PLL circuit 120 generates a clock signal (hereinafter also referred to as "internal clock signal") OSC_INT having the same frequency as the external clock signal based on the external clock signal OSC_XIN input from the oscillation circuit 110. The PLL circuit 120 outputs the internal clock signal OSC_INT to the detection circuit 140 and the multiplexer 150.

The phase comparator 121 converts the phase difference between the output signal of the frequency divider 124 and the external clock signal OSC_XIN into a voltage and outputs the voltage to the low-pass filter 122. The low-pass filter 122 smooths the output of the phase comparator 121. The low-pass filter 122 outputs to the voltage-controlled oscillator 123 and the memory unit 130 a voltage such that the phase difference between the output signal of the frequency divider 124 and the external clock signal OSC_XIN is canceled out. The output signal of the low-pass filter 122 can be a real-time signal (voltage signal) generated in real time by the external clock signal OSC_XIN.

The voltage-controlled oscillator 123 is an oscillator whose oscillation frequency is determined by an applied voltage. The voltage-controlled oscillator 123 is made of, for example, silicon. Therefore, the frequency accuracy of the voltage-controlled oscillator 123 is lower than the frequency accuracy of the external oscillator 200 (which is made of, for example, crystal or ceramic as mentioned above). With the voltage-controlled oscillator 123, a clock signal is generated based on the output voltage (real-time signal) of the low-pass filter 122 such that the phase difference between the output signal of the frequency divider 124 and the external clock signal OSC_XIN is canceled. For example, in the voltage-controlled oscillator 123, a clock signal is generated at the time of shipment inspection of the system 1 (the time at which accurate operation of the system 1 is guaranteed).

The voltage-controlled oscillator 123 includes, for example, a switch 126. The switch 126 switches the electrical connecting destination of the voltage-controlled oscillator 123 between the low-pass filter 122 and a D/A converter 136. Details will be described below. When the memory unit 130 stores information indicating an input voltage from the low-pass filter 122 after the output voltage of the low-pass filter 122 becomes stable, the connecting destination of the switch 126 is switched from the low-pass filter 122 to the D/A converter 136. That is, the input signal to the voltage-controlled oscillator 123 is switched from the output signal of the low-pass filter 122 to the output signal of the memory unit 130. Thereafter, the voltage-controlled oscillator 123 generates a clock signal based on a lock voltage input from the memory unit 130. That is, the internal clock signal OSC_INT is generated based on the lock voltage input from the memory unit 130, the voltage-controlled oscillator 123, and the frequency divider 125. Since the frequency is changed to 1/N by the frequency divider 124, a clock signal having a frequency N times the external clock signal OSC_XIN is generated in the voltage-controlled oscillator 123.

The frequency divider 125 multiplies the frequency of the clock signal generated by the voltage-controlled oscillator 123 by 1/N. As a result, an internal clock signal OSC_INT having the same frequency as the external clock signal is generated. The generated internal clock signal OSC_INT is output to the detection circuit 140 and the multiplexer 150.

The memory unit 130 includes an A/D converter (ADC) 132, a memory 134, and a D/A converter (DAC) 136. The A/D converter 132 is an electronic circuit that converts an analog signal into a digital signal. The A/D converter 132 receives voltage input from the low-pass filter 122. The A/D converter 132 converts an input voltage (the applied voltage of the voltage-controlled oscillator 123) from the low-pass filter 122 into a digital signal and outputs the digital signal to the memory 134.

The memory 134 is a nonvolatile memory, and is made of, for example, a flash memory or an OTPROM (One Time Programmable Read Only Memory). According to an instruction from the logic circuit 160, the memory 134 stores a digital signal (hereinafter also referred to as "voltage information") indicating an input voltage (the applied voltage of the voltage-controlled oscillator 123) from the low-pass filter 122.

For example, the logic circuit 160 receives an instruction from the microcomputer 300, and instructs the memory unit 130 to store the voltage information in the memory 134. For example, when communication with the electronic circuit 100 is started normally, the microcomputer 300 determines that the external oscillator 200 and the PLL circuit 120 have entered a stable oscillation state, and then instructs the logic circuit 160 to store the voltage information in the memory 134. As a result, the memory 134 stores the voltage information (information indicating the output voltage of the low-pass filter 122) at the time of stable oscillation of the external oscillator 200. It is preferable that the voltage information is fixed so it cannot be changed once it is stored in the memory 134. For example, the voltage information stored in the memory 134 is fixed when accurate operation of the system 1 is guaranteed at the time of shipment inspection or at a similar time, and the frequency of the internal clock signal OSC_INT is then determined based on the fixed voltage information. In such case, the internal clock signal OSC_INT is fixed at the same frequency as the external clock signal OSC_XIN.

The D/A converter 136 is an electronic circuit that converts a digital signal into an analog signal. The D/A converter 136 converts the voltage information stored in the memory 134 into an output voltage, and outputs the output voltage to the voltage-controlled oscillator 123. Once the voltage information is stored in the memory 134, the voltage-controlled oscillator 123 then generates a clock signal based on the voltage information stored in the memory 134 regardless of the input from the low-pass filter 122.

After the memory 134 stores the voltage information at the time of stable oscillation of the external oscillator 200, if the external oscillator 200 subsequently fails, the PLL circuit 120 can generate an internal clock signal having the same frequency as the external clock signal at the time of stable oscillation of the external oscillator 200, wherein the internal clock signal is generated based on the input lock voltage, the voltage-controlled oscillator 123, and the frequency divider 125.

The detection circuit 140 includes a counter and a comparator (not shown). The detection circuit 140 receives an external clock signal OSC_XIN from the oscillation circuit 110 and receives an internal clock signal OSC_INT from the PLL circuit 120. The detection circuit 140 detects an abnormality of the external oscillator 200 by comparing the external clock signal OSC_XIN with the internal clock signal OSC_INT.

When an abnormality of the external oscillator 200 is detected, the detection circuit 140 turns on a signal AB1 (hereinafter also referred to as "abnormality notification signal") to indicate that an abnormality has occurred in the external oscillator 200, and outputs the signal AB1 to the multiplexer 150 and the logic circuit 160. Upon receipt of the abnormality notification signal AB1 in ON state, the logic circuit 160 outputs an abnormality notification signal AB2 in ON state to the microcomputer 300. As a result, the microcomputer 300 can recognize that an abnormality has occurred in the external oscillator 200. The detection circuit 140 will be described in detail below.

The multiplexer 150 switches the clock signal to be output to the logic circuit 160 depending on whether the abnormality notification signal AB1 input from the detection circuit 140 is in ON state (abnormal) or OFF state (normal). The multiplexer 150 outputs the external clock signal OSC_XIN to the logic circuit 160 when the abnormality notification signal AB1 input from the detection circuit 140 is in OFF state (normal). The multiplexer 150 outputs the internal clock signal OSC_INT to the logic circuit 160 when the abnormality notification signal AB1 input from the detection circuit 140 is in ON state (abnormal). As a result, even if an abnormality occurs in the external oscillator 200, the logic circuit 160 can continue processing in synchronization with the internal clock signal OSC_INT.

The logic circuit 160 performs processing in synchronization with a clock signal (the external clock signal OSC_XIN at the time of normal operation of the external oscillator 200) input from the multiplexer 150. The logic circuit 160 controls the analog circuit 170 to realize the function of the electronic circuit 100 or communicates with the microcomputer 300 via the I/O circuit 180.

The analog circuit 170 is an electronic circuit for realizing the function of the electronic circuit 100. The analog circuit 170 is provided suitably configured in accordance with the function of the electronic circuit 100. The I/O circuit 180 is an interface circuit for realizing communication between the electronic circuit 100 and the microcomputer 300. Various known interface circuits can be adopted as the I/O circuit 180.

[Detection of Abnormality of the External Oscillator]

In order to operate the electronic circuit 100 using the PLL circuit 120 during the time of abnormality of the external oscillator 200, it is necessary that the clock frequency of the external oscillator 200 and the clock frequency of the PLL circuit 120 have a correlation.

As described above, with the clock generating device 105, the internal clock signal OSC_INT having the same frequency as the external clock signal OSC_XIN at the time of stable oscillation of the external oscillator 200 is generated by the PLL circuit 120. Therefore, when an abnormality (failure or the like) occurs in the external oscillator 200, if the logic circuit 160 is synchronized with the clock signal, which is switched from the external clock signal OSC_XIN to the internal clock signal OSC_INT, the electronic circuit 100 can maintain continuous operation. In order to switch the clock signal when an abnormality of the external oscillator 200 occurs, the clock generating device 105 needs to detect occurrence of abnormality in the external oscillator 200.

If the electronic circuit 100 is a dedicated product used in a specific system, the clock frequency necessary for the operation of the electronic circuit 100 can be specified in advance. Therefore, by detecting whether the low signal period and the high signal period of the clock signal generated by the external oscillator are normal or not, abnormality of the external oscillator can be detected.

However, as described above, the oscillation frequency of the external oscillator 200 is suitably selected in accordance with the specification of the system in which the electronic circuit 100 is used. Therefore, when the electronic circuit 100 is shipped, the oscillation frequency (the clock frequency to be used) of the external oscillator 200 cannot be specified. Therefore, an abnormality of the external oscillator 200 cannot be detected by the above method.

In the clock generating device 105, the detection circuit 140 detects an abnormality of the external oscillator 200. The clock frequency of the internal clock signal OSC_INT generated by the PLL circuit 120 is the same as the clock frequency of the external clock signal OSC_XIN during stable oscillation of the external oscillator 200. Therefore, when the difference between the clock frequency of the external clock signal OSC_XIN and the clock frequency of the internal clock signal OSC_INT is large, there is a high probability that an abnormality has occurred in the external oscillator 200.

The detection circuit 140 detects an abnormality of the external oscillator 200 by comparing the external clock signal OSC_XIN input from the oscillation circuit 110 and the internal clock signal OSC_INT input from the PLL circuit 120. Similar to the storage timing of the voltage information in the memory 134, after the external oscillator 200 and the PLL circuit 120 enter stable oscillation states, the determination of whether or not the external oscillator 200 is abnormal by the detection circuit 140 is started in accordance with an instruction from the logic circuit 160.

A specific example of a method for detecting abnormality of the external oscillator 200 by the detection circuit 140 is described as follows. For example, the detection circuit 140 detects an abnormality of the external oscillator 200 by comparing the number of rising edges of the external clock signal OSC_XIN to the number of rising edges of the internal clock signal OSC_INT within a predetermined period. Specifically, the detection circuit 140 detects an abnormality of the external oscillator 200 when the difference between the number of rising edges of the external clock signal OSC_XIN and the number of rising edges of the internal clock signal OSC_INT within a predetermined period is two or more. On the other hand, when the difference between the number of rising edges of the external clock signal OSC_XIN and the number of rising edges of the internal clock signal OSC_INT within a predetermined period is one or less, the detection circuit 140 determines that the external oscillator 200 is normal.

The following explains why an abnormality of the external oscillator 200 is determined based on the difference in the number of rising edges being two or more. If the external oscillator 200 has been used for a significant length of time, even under normal operation, the phase difference between the external clock signal OSC_XIN and the internal clock signal OSC_INT increases. As the phase difference increases, even under normal operation of the external oscillator 200, there is a possibility that the maximum difference in the number of rising edges within a given period is one. Since the maximum of the phase difference is one cycle, even if there is a difference in the number of rising edges, such difference does not exceed one as long as the external oscillator 200 is normal. Therefore, with the clock generating device 105, abnormality of the external oscillator 200 is detected for the first time when the difference in the number of rising edges becomes two or more. Therefore, even if the phase difference between the external clock signal OSC_XIN and the internal clock signal OSC_INT increases, the possibility of erroneously detecting an abnormality of the external oscillator 200 can be reduced.

Figure 2:
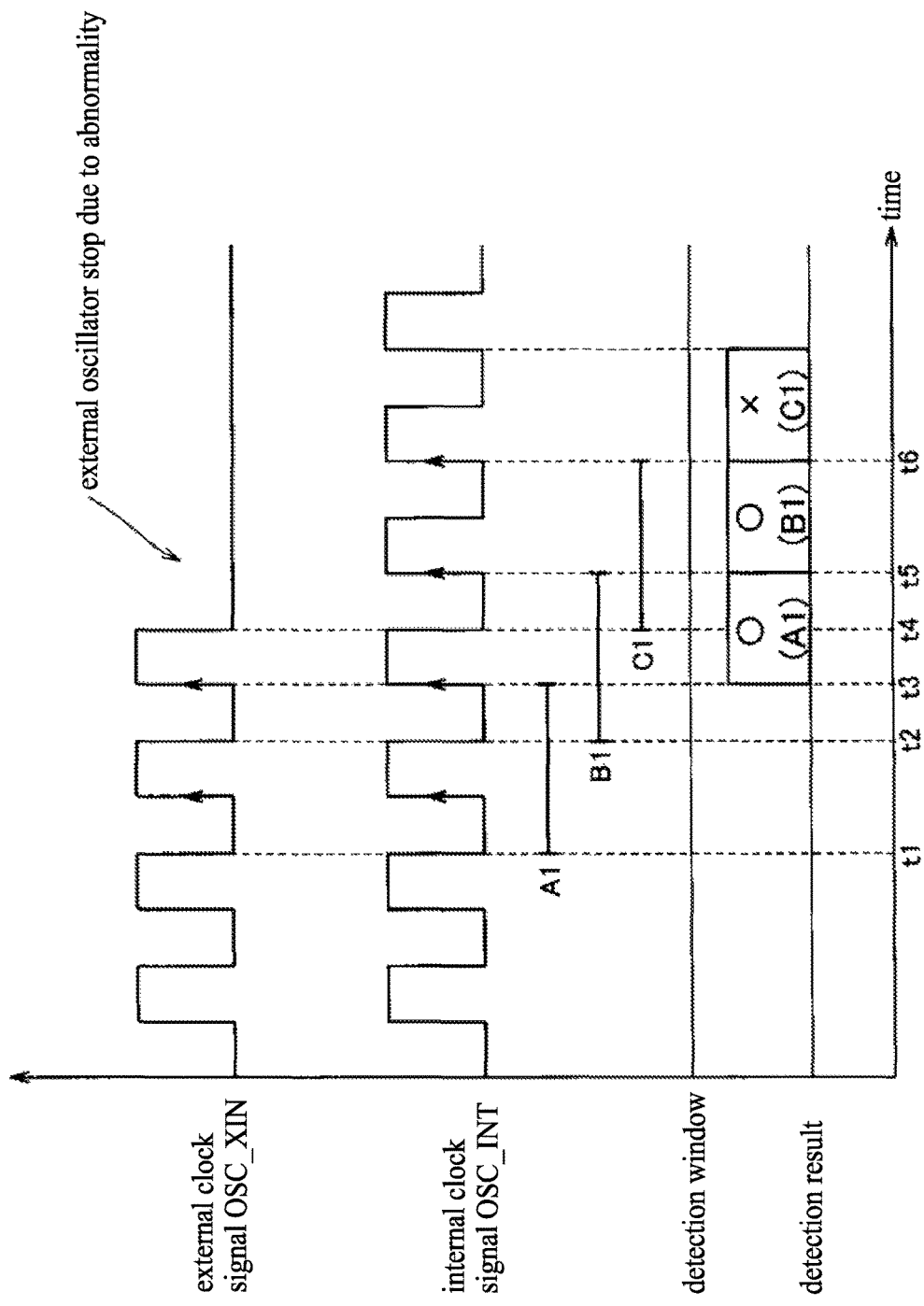
FIG. 2 is a diagram for illustrating an example of a method for detecting abnormality of an external oscillator by a detection circuit.

FIG. 2 is a diagram to illustrate an example of a method for detecting abnormality of the external oscillator 200 by the detection circuit 140. The horizontal axis shows time. The vertical axis indicates an example of the external clock signal OSC_XIN, an example of the internal clock signal OSC_INT, an example of a detection window (predetermined period) for detecting an abnormality of the external oscillator 200, and a detection result.

In this example, when the difference between the number of rising edges of the external clock signal OSC_XIN and the number of rising edges of the internal clock signal OSC_INT within a predetermined period (the period from the timing of 1.5 clock periods before the abnormality detection timing to the abnormality detection timing) becomes two or more, an abnormality of the external oscillator 200 is detected. It should be noted that the predetermined period is set by receiving an instruction from the microcomputer 300 according to the specification of the system 1.

The abnormality detection at timing t3 is performed based on the difference between the number of rising edges of the external clock signal OSC_XIN and the number of rising edges of the internal clock signal OSC_INT within a detection window A1 (timing t1 to timing t3). The number of rising edges of the external clock signal OSC_XIN included in the detection window A1 is two, and the number of rising edges of the internal clock signal OSC_INT included in the detection window A1 is also two. Therefore, since the difference is zero (<2), the external oscillator 200 is determined to be normal (indicated by an O in the diagram).

The abnormality detection at timing t5 is performed using a detection window B1 (timing t2 to timing t5). The number of rising edges of the external clock signal OSC_XIN included in the detection window B1 is one, and the number of rising edges of the internal clock signal OSC_INT included in the detection window B1 is two. Therefore, since the difference is one (<2), the external oscillator 200 is determined to be normal.

The abnormality detection at timing t6 is performed using the detection window C (timing t4 to timing t6). The number of rising edges of the external clock signal OSC_XIN included in the detection window C1 is zero, and the number of rising edges of the internal clock signal OSC_INT included in the detection window C1 is two. Therefore, since the difference is two (≥2), an abnormality (indicated by an X in the figure) of the external oscillator 200 is detected.

As described above, with the clock generating device 105 according to the first embodiment, an internal clock signal OSC_INT having the same frequency as the external clock signal OSC_XIN at the time of stable oscillation of the external oscillator 200 is generated by the PLL circuit 120. With the clock generating device 105, an internal clock signal correlated with the clock frequency of the external oscillator 200 can be generated.

With the clock generating device 105 of the first embodiment, an abnormality of the external oscillator 200 is detected by comparing the external clock signal OSC_XIN and the internal clock signal OSC_INT. With the clock generating device 105, even if the clock frequency used in the electronic circuit 100 is not specified in advance, it is possible to detect an abnormality of the external oscillator 200.

[Example of Procedure for Detecting Abnormality of the External Oscillator]

A specific example of the procedure for detecting abnormality of the external oscillator 200 in the first embodiment is described below.

Figure 3:
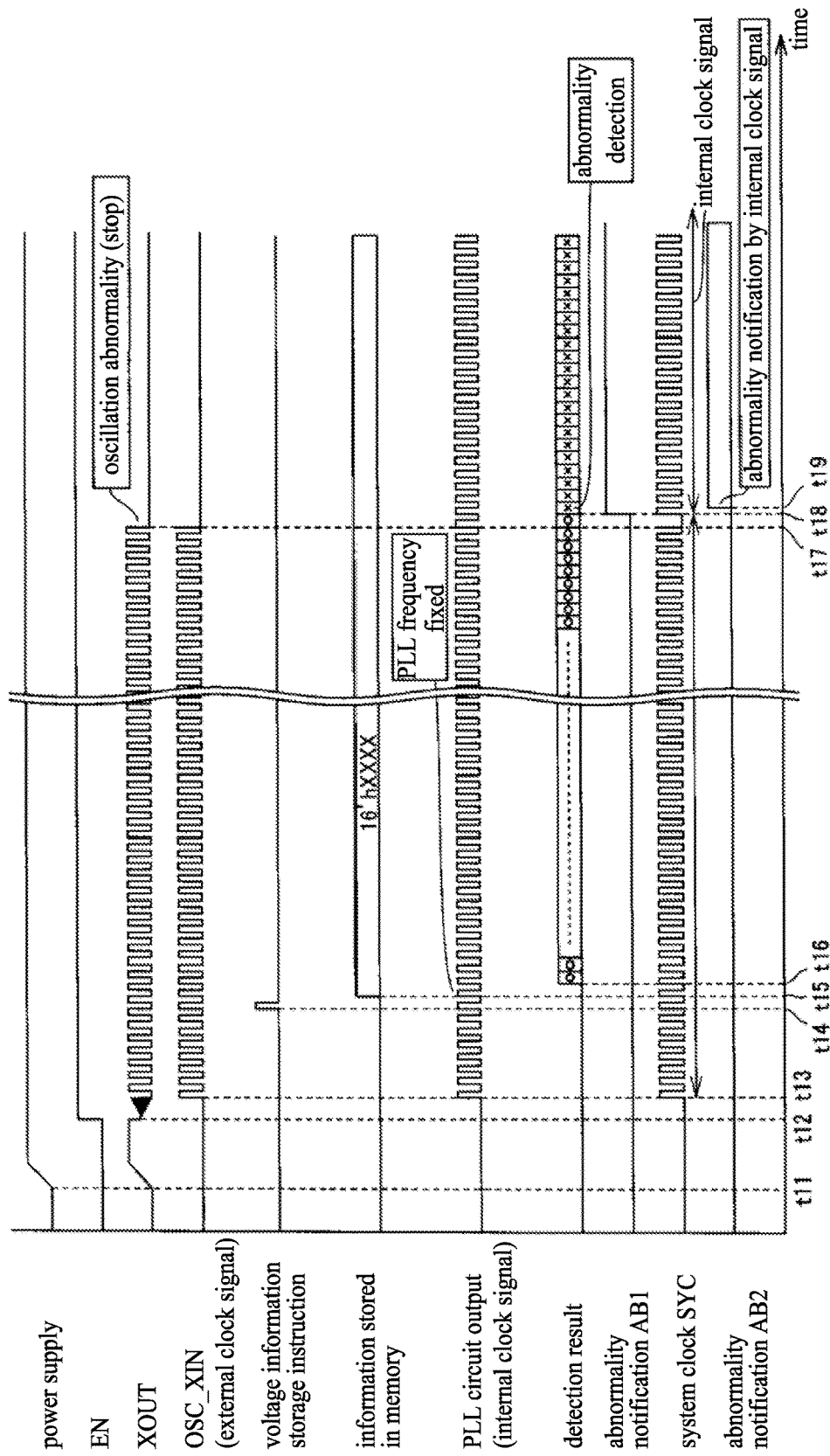
FIG. 3 is a time chart for illustrating a specific example of the procedure of abnormality detection of an external oscillator.

FIG. 3 is a time chart to illustrate a specific example of the procedure for detecting abnormality of the external oscillator 200. The horizontal axis shows time. The vertical axis shows: power supply for supplying power to the external oscillator 200; enable signal EN; output XOUT of the NAND circuit 114; output OSC_XIN (external clock signal) of the AND circuit 112; instruction to store the voltage information; stored information of the memory 134; output OSC_INT (internal clock signal) of the PLL circuit 120; detection result by the detection circuit 140; abnormality notification signal AB1 output by the detection circuit 140; system clock SYC output by the multiplexer 150; and abnormality notification signal AB2 output by the logic circuit 160.

At timing t11, the enable signal EN is in OFF state. In such state, when the power supply for supplying power to the external oscillator 200 is switched to the ON state, the output XOUT of the NAND circuit 114 always outputs a high signal.

The enable signal EN is switched to the ON state at timing t12. At timing t13: the AND circuit 112 outputs "high" at the timing when the external clock signal XIN indicates "high"; the AND circuit 112 outputs "low" at the timing when the external clock signal XIN indicates "low." Thus the output OSC_XIN of the AND circuit 112 starts oscillating. Next, the NAND circuit 114 outputs "low" at the timing when the external clock signal XIN indicates "high," and the NAND circuit 114 outputs "high" at the timing when the external clock signal XIN indicates "low." Therefore, the output XOUT of the NAND circuit 114 starts oscillating invertly from the output OSC_XIN of the AND circuit 112.

Since the voltage information is not stored in the memory 134 at timing t13, the output of the PLL circuit 120 starts oscillating in accordance with the oscillation of the output OSC_XIN of the AND circuit 112. Since no abnormality of the external oscillator 200 is detected, the output OSC_XIN (external clock signal) of the AND circuit 112 is output from the multiplexer 150 to the logic circuit 160 as the system clock SYC.

When the output OSC_XIN of the AND circuit 112 and the output OSC_INT of the PLL circuit 120 enter the stable oscillation state, and when communication between the electronic circuit 100 and the microcomputer 300 starts normally, the logic circuit 160 receives an instruction to store the voltage information from the microcomputer 300 at timing t14. Next, the logic circuit 160 outputs an instruction to store the voltage information to the memory unit 130, and the voltage information is stored in the memory 134 at timing t15. When the voltage information is stored in the memory 134, the voltage applied to the voltage-controlled oscillator 123 is fixed to the voltage stored in the memory 134. Therefore, the clock frequency of the internal clock signal OSC_INT generated by the PLL circuit 120 is fixed.

At timing t16, determination of the presence or absence of abnormality of the external oscillator 200 by the detection circuit 140 is started. Specifically, by comparing the number of rising edges of the internal clock signal OSC_INT to the number of rising edges of the external clock signal OSC_XIN within a predetermined period, the detection circuit 140 determines whether or not an abnormality has occurred in the external oscillator 200.

When an abnormality occurs in the external oscillator 200 at timing t17, the oscillation of the outputs of the NAND circuit 114 and the AND circuit 112 is stopped, and the system clock SYC output from the multiplexer 150 also stops accordingly.

When the detection circuit 140 detects an abnormality of the external oscillator 200 at timing t18, the detection circuit 140 outputs an abnormality notification signal AB1 in ON state to the multiplexer 150 and the logic circuit 160. When the abnormality notification signal AB1 in ON state is input to the multiplexer 150, the multiplexer 150 switches the output system clock SYC from the external clock signal OSC_XIN to the internal clock signal OSC_INT. As a result, the clock signal output from the multiplexer 150 oscillates at the clock frequency at the time of stable oscillation of the external oscillator 200. As a result, the electronic circuit 100 can continue operation according to the internal clock signal OSC_INT. When the abnormality notification signal AB1 in ON state is input to the logic circuit 160, the logic circuit 160 outputs an abnormality notification signal AB2 in ON state to the microcomputer 300 at timing t19. As a result, the microcomputer 300 can recognize that an abnormality has occurred in the external oscillator 200.

In this way, with the clock generating device 105 according to the first embodiment, the internal clock signal OSC_INT having the same frequency as the external clock signal OSC_XIN at the time of stable oscillation of the external oscillator 200 is generated by the PLL circuit 120. With the clock generating device 105, an internal clock signal correlated with the clock frequency of the external oscillator 200 can be generated.

With the clock generating device 105 of the first embodiment, by comparing the external clock signal OSC_XIN and the internal clock signal OSC_INT (a clock signal having the same frequency as the external clock signal OSC_XIN at the time of stable oscillation), an abnormality of the external oscillator 200 is detected. With the clock generating device 105, even if the clock frequency to be used is not specified in advance, it is possible to detect an abnormality of the external oscillator 200.

Second Embodiment

With the clock generating device 105 according to the first embodiment, an abnormality of the external oscillator 200 is detected by comparing the number of rising edges of the external clock signal to the number of rising edges of the internal clock signal within a predetermined period. With a clock generating device 105A according to a second embodiment, by comparing the voltage stored in the memory 134 at the time of stable oscillation of the external oscillator to the voltage output by the low-pass filter 122 based on the external clock signal currently generated by the external oscillator, an abnormality of the external oscillator is detected. Hereinafter, an electronic circuit 100A including the clock generating device 105A according to the second embodiment will be described focusing on differences from the electronic circuit 100 according to the first embodiment.

Figure 4:
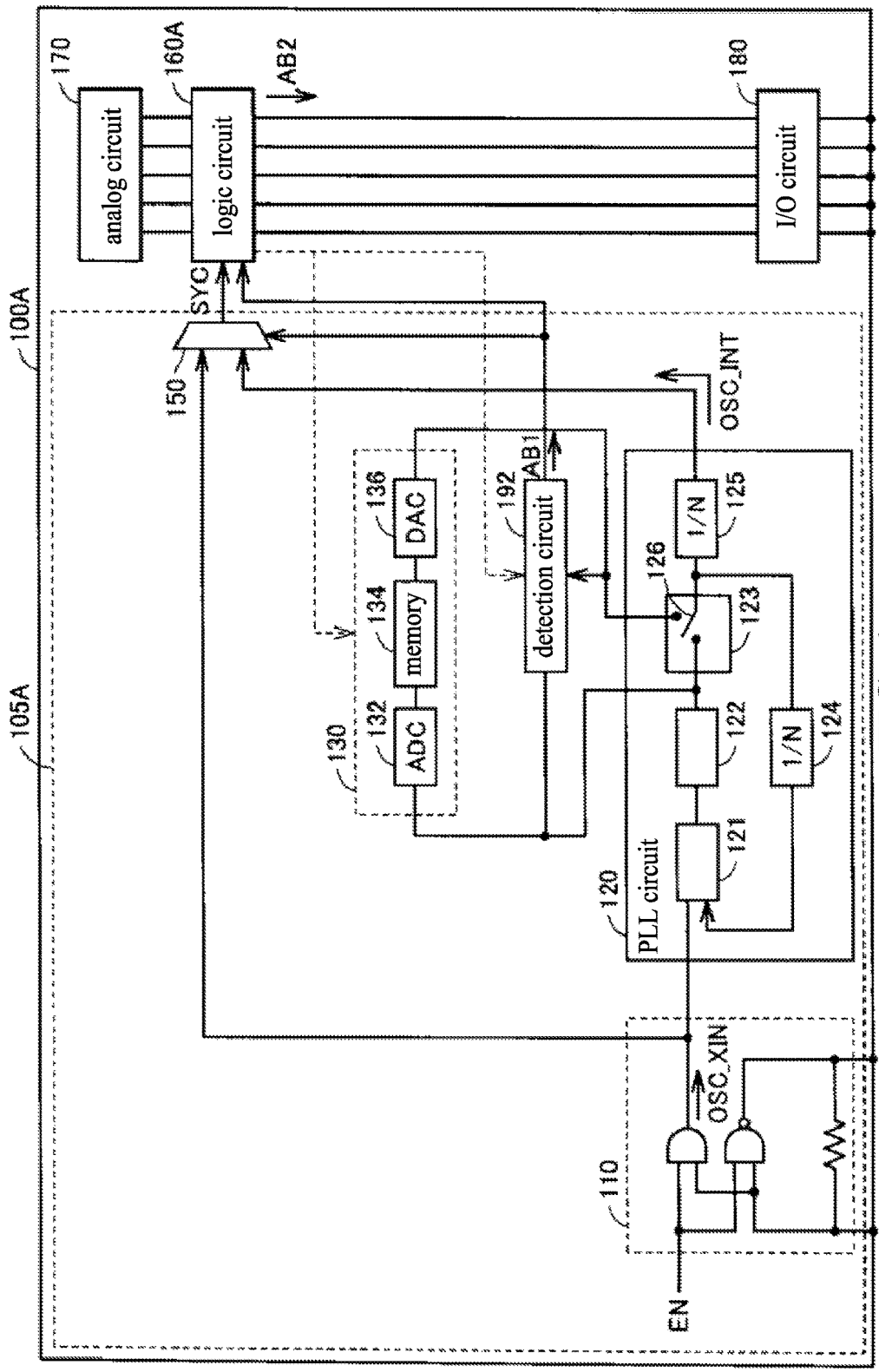
FIG. 4 is a configuration diagram of an electronic circuit according to a second embodiment.

FIG. 4 is a configuration diagram of the electronic circuit 100A according to the second embodiment. Referring to FIG. 4, the electronic circuit 100A includes a clock generating device 105A instead of the clock generating device 105 (shown in FIG. 1) of the electronic circuit 100 according to the first embodiment. The clock generating device 105A includes a detection circuit 192 instead of the detection circuit 140 of FIG. 1.

When an abnormality occurs in the external oscillator (not shown), the voltage output by the low-pass filter 122 fluctuates. For example, when the oscillation of the external oscillator stops, the voltage output by the low-pass filter 122 approaches zero.

The detection circuit 192 detects an abnormality of the external oscillator by comparing the voltage (real-time signal) output by the low-pass filter 122 with the voltage output by the D/A convener 136. As in the first embodiment, the memory 134 stores the voltage information for realizing the clock frequency of the external oscillator at the time of stable oscillation. That is, the voltage output from the D/A converter 136 is a voltage for realizing the clock frequency of the external oscillator at the time of stable oscillation. When the difference between the voltage output by the low-pass filter 122 and the voltage output by the D/A converter 136 is larger than a predetermined value, there is a high probability that an abnormality has occurred in the external oscillator. Therefore, the detection circuit 192 detects an abnormality of the external oscillator when the difference between the voltage output by the low-pass filter 122 and the voltage output by the D/A converter 136 is larger than a predetermined value.

After the external clock signal OSC_XIN and the internal clock signal OSC_INT enter the stable oscillation state, the detection circuit 192 starts determining the presence or absence of abnormality of the external oscillator according to an instruction from the logic circuit 160A. In accordance with an instruction from a main microcomputer (not shown) connected through the I/O circuit 180, the logic circuit 160A instructs the detection circuit 192 to start determining the presence or absence of abnormality of the external oscillator. Upon detecting an abnormality of the external oscillator, the detection circuit 192 outputs the abnormality notification signal AB1 in ON state to the multiplexer 150 and the logic circuit 160A.

Upon receiving the abnormality notification signal AB1 in ON state, the multiplexer 150 switches the output clock signal SYC from the external clock signal OSC_XIN to the internal clock signal OSC_INT. As a result, the electronic circuit 100A can continue operation based on the internal clock signal OSC_INT even if an abnormality occurs in the external oscillator.

Upon receiving the abnormality notification signal AB1 in ON state, the logic circuit 160A outputs the abnormality notification signal AB2 in ON state to the main microcomputer connected through the I/O circuit 180. As a result, the main microcomputer can recognize that an abnormality has occurred in the external oscillator.

As described above, with the clock generating device 105A according to the second embodiment, the internal clock signal OSC_INT having the same frequency as the external clock signal OSC_XIN at the time of stable oscillation of the external oscillator is generated by the PLL circuit 120. With the clock generating device 105A, even if the clock frequency to be used is not specified in advance, it is possible to detect an abnormality of the external oscillator 200.

With the clock generating device 105A of the second embodiment, by comparing the voltage stored in the memory 134 at the time of stable oscillation of the external oscillator to the voltage output by the low-pass filter 122 based on the external clock signal currently generated by the external oscillator, abnormality of the external oscillator is detected. With the clock generating device 105A, even if the clock frequency to be used is not specified in advance, abnormality of the external oscillator can be detected.

Another Embodiment

The first embodiment and the second embodiment have been described as embodiments of the present invention. However, the present invention is not necessarily limited to the first embodiment or the second embodiment. An example of another embodiment is described below.

In the first and second embodiments, the PLL circuit 120 generates the internal clock signal OSC_INT having the same frequency as the external clock signal OSC_XIN. However, the internal clock signal OSC_INT generated by the PLL circuit 120 does not have to have exactly the same frequency as the external clock signal OSC_XIN. For example, there may be some frequency differences. If the correlation between the internal clock signal generated by the PLL circuit 120 and the external clock signal can be specified in advance, even if there is some difference in frequency between the internal clock signal and the external clock signal, the detection circuit 140 can detect an abnormality of the external oscillator by comparing the internal clock signal to the external clock signal while taking the correlation into consideration.

In the first and second embodiments, the logic circuits 160 and 160A instruct the memory 134 to store the voltage information in accordance with an instruction from the main microcomputer. However, the trigger for the memory 134 to store the voltage information is not limited to an instruction from the main microcomputer. For example, a timer may be provided. In such case, for example, the length of time during which the oscillation of the external clock signal and the oscillation of the internal clock signal will stabilize after the external oscillator 200 begins oscillating is predetermined. After the oscillation of the external oscillator 200 is started, the voltage information may be stored in the memory 134 at a timing when a predetermined length of time is counted by the timer.

In the first and second embodiments, the voltage-controlled oscillator 123 includes the switch 126. However, the switch 126 is not necessarily included in the voltage-controlled oscillator 123. For example, a switch may be provided in the path between the oscillation circuit 110 and the voltage-controlled oscillator 123, and in the path between the memory 134 and the voltage-controlled oscillator 123. In such case, before the voltage information is stored in the memory 134, the switch provided in the path between the oscillation circuit 110 and the voltage-controlled oscillator 123 is turned on, and the switch provided in the path between the memory 134 and the voltage-controlled oscillator 123 is turned off. After the voltage information is stored in the memory 134, the switch provided in the path between the oscillation circuit 110 and the voltage-controlled oscillator 123 is turned off, and the switch provided in the path between the memory 134 and the voltage-controlled oscillator 123 is turned on.

In the first and second embodiments, the oscillation circuit 110 is included in the electronic circuits 100 and 100A. However, the oscillation circuit 110 is not necessarily included in the electronic circuits 100 and 100A. For example, the oscillation circuit 110 may be provided outside the electronic circuits 100 and 100A.

Figure 5:
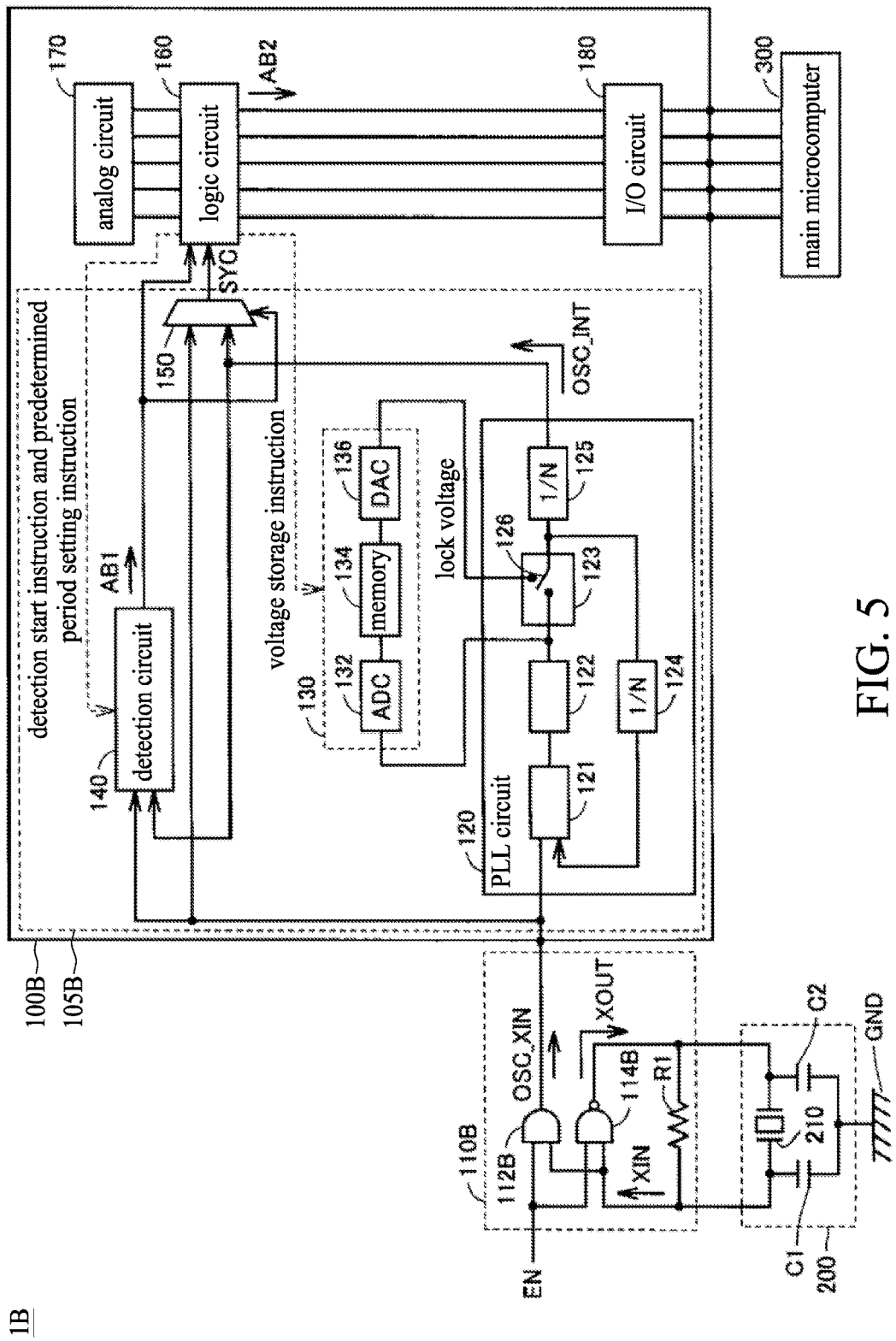
FIG. 5 is a configuration diagram of a system to which an electronic circuit, as a first example of another embodiment, is applied.

FIG. 5 is a configuration diagram of a system to which a first example of an electronic circuit in another embodiment is applied. Referring to FIG. 5, an electronic circuit 100B included in a system 1B does not include an oscillation circuit 110B, in contrast to the electronic circuit 100 in the first embodiment. The oscillation circuit 110B is provided outside the electronic circuit 100B. In such case, the external clock signal generated by the external oscillation circuit 110B is used in the clock generating device 105B.

Figure 6:
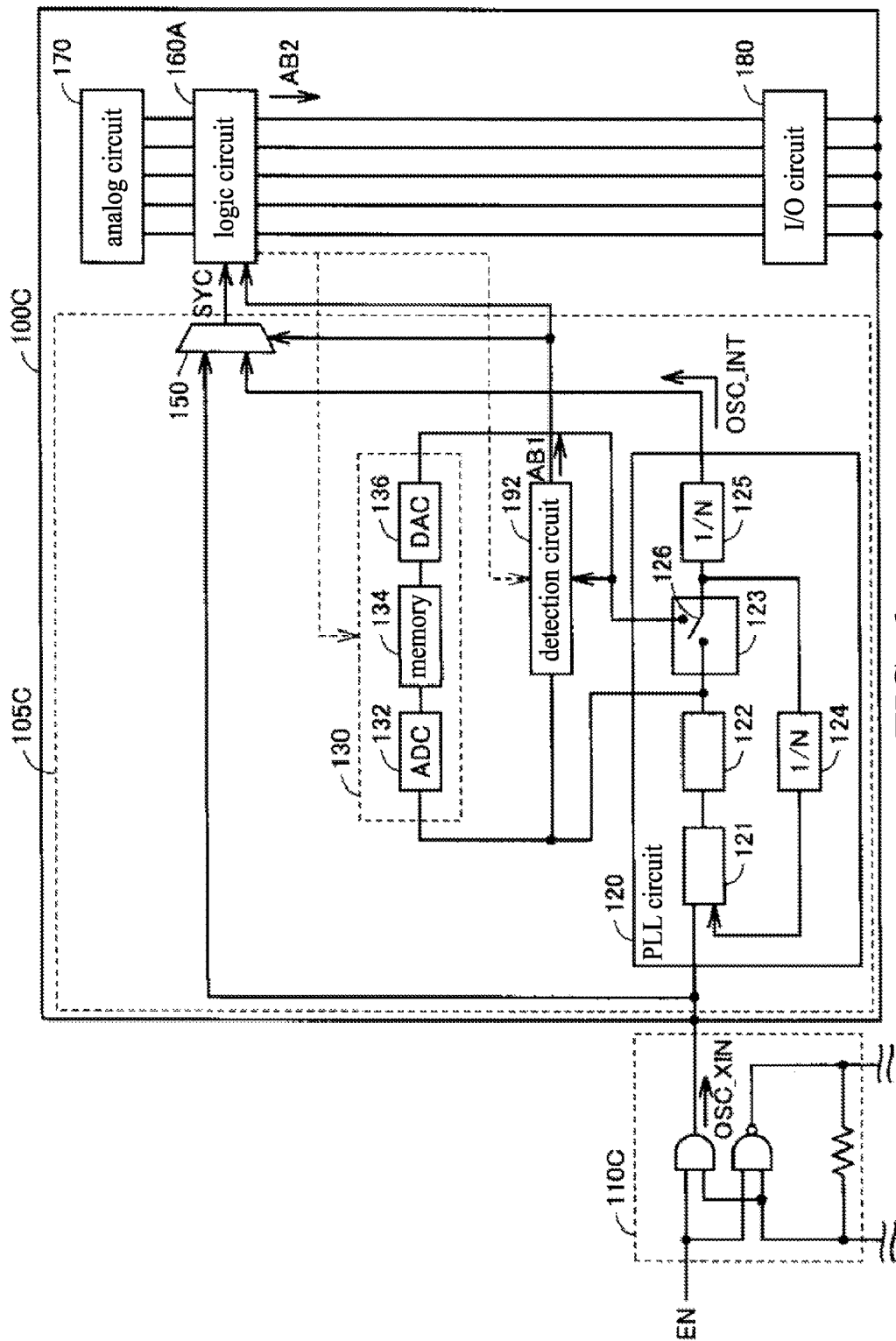
FIG. 6 is a configuration diagram showing an electronic circuit as a second example of another embodiment.

FIG. 6 is a configuration diagram showing a second example of an electronic circuit in another embodiment. Referring to FIG. 6, an electronic circuit 100C does not include an oscillation circuit 110C, in contrast to the electronic circuit 100A in the second embodiment. The oscillation circuit 110C is provided outside the electronic circuit 100C. In such case, the external clock signal generated by the external oscillation circuit 110C is used by the clock generating device 105C.

In the first embodiment, when comparing the internal clock signal to the external clock signal, 1.5 clock cycles are exemplified as the size (predetermined period) of the detection window. However, the size of the detection window is not limited to 1.5 clock cycles. For example, the size of the detection window may be 10, 100 or 1000 clock cycles. In any case, the detection circuit 140 detects an abnormality of the external oscillator 200 when the difference between the number of rising edges of the internal clock signal and the number of rising edges of the external clock signal within a predetermined period becomes two or more.

In the first embodiment, the detection circuit 140 detects an abnormality of the external oscillator 200 by comparing the number of rising edges included in the external clock signal to the number of rising edges included in the internal clock signal each time. However, the target to be compared to the number of rising edges included in the external clock signal is not limited thereto. For example, after the voltage information is stored in the memory 134, an expected value of the number of rising edges included in the internal clock signal within a predetermined period is calculated. The detection circuit 140 may detect an abnormality of the external oscillator 200 by comparing the number of rising edges included in the external clock signal to the previously calculated expected value. Therefore, it is unnecessary to count the number of rising edges included in the internal clock signal each time, and the process can be simplified.

As a system to which the system 1 of the first embodiment and the electronic circuit 100A of the second embodiment are applied, electrical machinery such as an industrial machine, a medical device, a vehicle, or the like is assumed.

As stated above, the clock generating devices 105 and 105A correspond to an embodiment of "clock generating device" in the present invention, the electronic circuits 100 and 100A correspond to an embodiment of "electronic circuit" in the present invention, and the external oscillator 200 corresponds to an embodiment of "first oscillator" in the present invention. The PLL circuit 120 corresponds to an embodiment of "second oscillator" in the present invention, the memory 134 corresponds to an embodiment of "memory" in the present invention, and the detection circuits 140 and 192 correspond to an embodiment of "detection circuit" in the present invention.

It should be considered that embodiments disclosed above are examples in all respects and are not restrictive. The scope of the present invention is not limited to the above description, but is indicated by the claims, and it is intended that all modifications within meaning and scope equivalent to the claims are included.

What is claimed is:

1. A clock generating device using a first clock signal generated in accordance with oscillation of a first oscillator externally provided, the device comprising:
   a memory unit configured to store information on a frequency of the first clock signal at a predetermined timing, and output, after the predetermined timing, an output signal indicating the information stored at the predetermined timing; and
   a second oscillator, coupled to the memory unit, the second oscillator being configured for providing the information on the frequency of the first clock signal, and receiving, after the predetermined timing, the output signal indicating the information stored at the predetermined timing to generate a second clock signal correlated with the first clock signal.

2. The clock generating device of claim 1, wherein the predetermined timing is when the first oscillator stably oscillates.

3. The clock generating device of claim 1, wherein the predetermined timing is when an instruction is received from a microcomputer external to the clock generating device.

4. The clock generating device of claim 1, further comprising a timer, wherein the predetermined timing is when the timer measures a predetermined length of time.

5. The clock generating device of claim 1, wherein one of the first clock signal and the second clock signal is output by the clock generating device.

6. The clock generating device of claim 1, wherein the second oscillator is a PLL (Phase Locked Loop) circuit comprising a voltage-controlled oscillator, and the information indicates a voltage applied to the voltage-controlled oscillator in order to generate a signal having a frequency corresponding to the frequency of the first clock signal.

7. The clock generating device of claim 6, wherein the voltage-controlled oscillator generates a third clock signal based on a real-time signal generated in real time by the first clock signal before the information is stored in the memory unit, and generates the second clock signal based on the information after the information is stored in the memory unit.

8. The clock generating device of claim 7, wherein the real-time signal is a voltage signal generated in real time by the first clock signal.

9. The clock generating device of claim 1, further comprising a detection circuit for detecting abnormality of the first oscillator by comparing the first clock signal to the second clock signal.

10. The clock generating device of claim 9, wherein the detection circuit detects abnormality of the first oscillator when a difference between a number of rising edges of the first clock signal and a number of rising edges of the second clock signal in a predetermined time period becomes two or more.

11. The clock generating device of claim 7, further comprising a detection circuit for detecting abnormality of the first oscillator by comparing the real-time signal with a signal based on the information.

12. The clock generating device of claim 9, wherein, when abnormality of the first oscillator is detected by the detection circuit, the second clock signal is output instead of the first clock signal.

13. The clock generating device of claim 1, wherein the information is fixed once stored in the memory unit.

14. The clock generating device of claim 1, wherein the memory unit comprises an OTPROM (One Time Programmable Read Only Memory).

15. The clock generating device of claim 1, wherein the frequency of the first clock signal is the same as a frequency of the second clock signal.

16. An electronic circuit, comprising:
the clock generating device of claim 1;
a logic circuit for performing processing in synchronization with the first clock signal or the second clock signal output from the clock generating device; and
an analog circuit and an I/O circuit, respectively connected to the logic circuit.

17. An integrated circuit, integrated with the clock generating device of claim 1.

18. An electrical machine, equipped with the clock generating device of claim 1.

19. The clock generating device of claim 1, wherein the second oscillator is a PLL circuit comprising a voltage-controlled oscillator, and the clock generating device further comprises:
a first signal path, coupled to the first oscillator, wherein the second oscillator is selectively coupled to the first signal path to receive the first clock signal outputted from the first oscillator; and
a second signal path, coupled to the memory unit, wherein the second oscillator is selectively coupled to the second signal path to receive the output signal indicating the information stored at the predetermined timing;
wherein when the second oscillator is coupled to one of the first signal path and the second signal path, the second oscillator is uncoupled from the other of the first signal path and the second signal path.

20. The clock generating device of claim 19, wherein before the information is stored in the memory unit, the second oscillator is coupled to the first signal path to receive the first clock signal; after the information is stored in the memory unit, the second oscillator is coupled to the second signal path to receive the output signal.

* * * * *